(12) United States Patent
Wu et al.

(10) Patent No.: US 7,638,262 B2
(45) Date of Patent: Dec. 29, 2009

(54) ANTIREFLECTIVE COMPOSITION FOR PHOTORESISTS

(75) Inventors: Hengpeng Wu, Hillborough, NJ (US); Zhong Xiang, Orlando, FL (US); Hong Zhuang, Raritan, NJ (US); Jianhui Shan, Pennington, NJ (US); Jian Yin, Bridgewater, NJ (US); Huirong Yao, Plainsboro, NJ (US); PingHung Lu, Bridgewater, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 34 days.

(21) Appl. No.: 11/502,706

(22) Filed: Aug. 10, 2006

(65) Prior Publication Data

US 2008/0038659 A1    Feb. 14, 2008

(51) Int. Cl.
G03F 7/095 (2006.01)
G03F 7/11 (2006.01)
G03F 7/38 (2006.01)
G03F 7/09 (2006.01)

(52) U.S. Cl. .................... 430/271.1; 430/311; 430/330; 430/325; 430/326; 525/418; 528/288; 528/296; 438/952

(58) Field of Classification Search ........................ None
See application file for complete search history.

(56) References Cited

U.S. PATENT DOCUMENTS 3,474,058 A    10/1969    Ridgeway et al.

(Continued)

FOREIGN PATENT DOCUMENTS

WO    WO 01/98834 A1    12/2001

(Continued)

OTHER PUBLICATIONS

March, Jerry, Advanced Organic Chemistry; Reactions, Mechanisms, and Structure, second edition, Mc Graw Hill Book Company, New York, NY, 1977 (no month), pp. 41-69.*

(Continued)

*Primary Examiner*—Cynthia Hamilton
(74) *Attorney, Agent, or Firm*—Sangya Jain

(57) ABSTRACT

The invention relates to an antireflective coating composition for a photoresist layer comprising a polymer, a crosslinking agent and an acid generator, where the polymer comprises at least one unit of structure 1, (1)

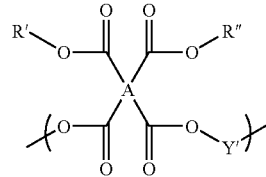

where,
A is a nonaromatic linking moiety,
R' and R" are independently selected from hydrogen, Z and W—OH, where Z is a $(C_1-C_{20})$ hydrocarbyl moiety and W is a $(C_1-C_{20})$ hydrocarbyl linking moiety, and,
Y' is independently a $(C_1-C_{20})$ hydrocarbyl linking moiety.

The invention further relates to a process for imaging the antireflective coating composition.

20 Claims, 4 Drawing Sheets

Further examples of polymer unit of Structure (1)

U.S. PATENT DOCUMENTS

| | | | |
|---|---|---|---|
| 4,200,729 | A | 4/1980 | Calbo |
| 4,251,665 | A | 2/1981 | Calbo |
| 4,491,628 | A | 1/1985 | Ito et al. |
| 5,187,019 | A | 2/1993 | Calbo et al. |
| 5,350,660 | A | 9/1994 | Urano et al. |
| 5,843,624 | A | 12/1998 | Houlihan et al. |
| 5,935,760 | A * | 8/1999 | Shao et al. ............... 430/271.1 |
| 6,447,980 | B1 | 9/2002 | Rahman et al. |
| 6,723,488 | B2 | 4/2004 | Kudo et al. |
| 6,790,587 | B1 | 9/2004 | Feiring et al. |
| 6,818,258 | B2 | 11/2004 | Kaneko et al. |
| 6,849,377 | B2 | 2/2005 | Feiring et al. |
| 6,866,984 | B2 | 3/2005 | Jung et al. |
| 6,916,590 | B2 | 7/2005 | Kaneko et al. |
| 7,081,511 | B2 | 7/2006 | Wu et al. |
| 7,264,913 | B2 | 9/2007 | Wu et al. |
| 2003/0148213 | A1 | 8/2003 | Kaneko et al. |
| 2004/0101779 | A1 | 5/2004 | Wu et al. |
| 2005/0234201 | A1 | 10/2005 | Wu et al. |
| 2006/0058468 | A1 | 3/2006 | Wu et al. |

FOREIGN PATENT DOCUMENTS

| | | |
|---|---|---|
| WO | WO-2005/044893 A1 * | 5/2005 |
| WO | WO 2005/097867 A1 | 10/2005 |

OTHER PUBLICATIONS 178586 bicyclo[2.2.2]oct-7-ene-2,3,5,6-tetracarboxylic dianhydride, from www.sigma-aldrich.com;catalog/search product Detail/ALDRICH/178586, printed out Oct. 24, 2007, three pages.*
Notification of Transmittal of the International Search Report and the Written Opinion of the International Searching Authority, or the Declaration (Form PCT/ISA/220) for PCT/IB2007/002340.
International Search Report (form PCT/ISA/210) for PCT/IB2007/002340.
Written Opinion of the International Searching Authority (PCT/ISA/237) for PCT/IB2007/002340.
Notification Concerning Transmittal of Copy Of International Preliminary Report on Patentability (Chapter 1 of the Patent Cooperation Treaty) (Form PCT/IB/326), and International Preliminary Report on Patentability (Form PCT/IB/373) for PCT/IB2007/002340.

* cited by examiner

Figure 1: Examples of the linking moiety A
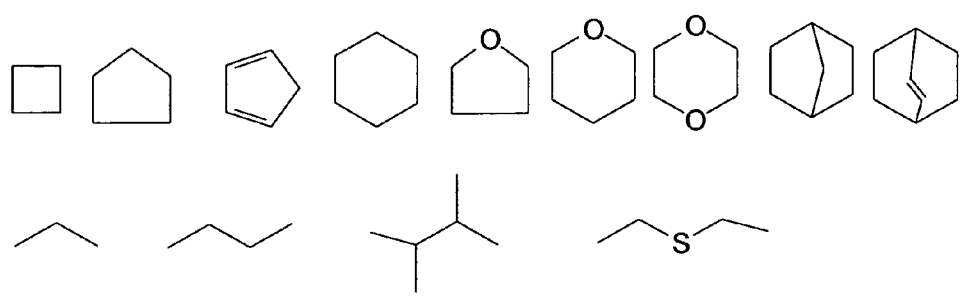

Figure 2: Examples of aliphatic dianhydrides
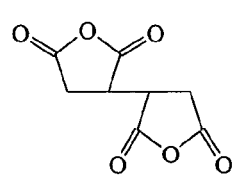 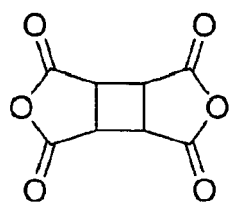 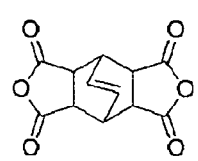 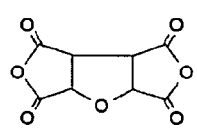
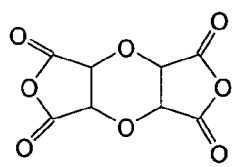 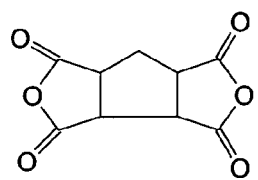 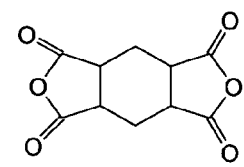
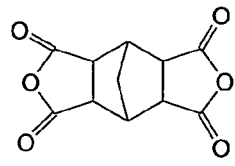 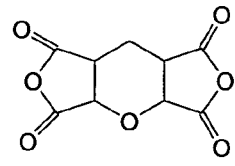 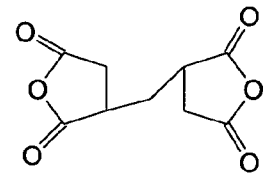
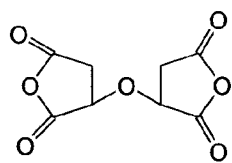

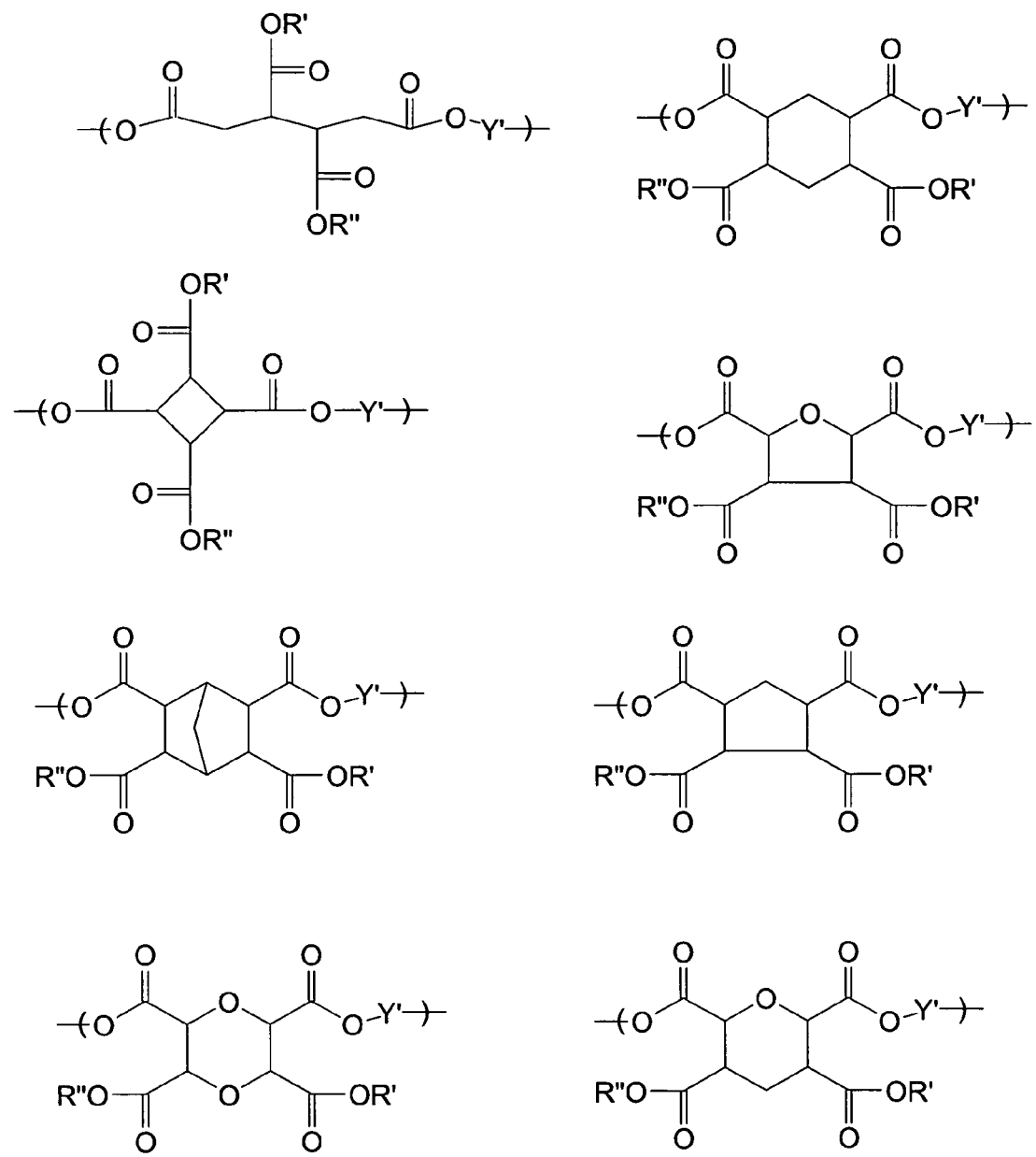
Figure 3: Examples of polymer unit of Structure (1)

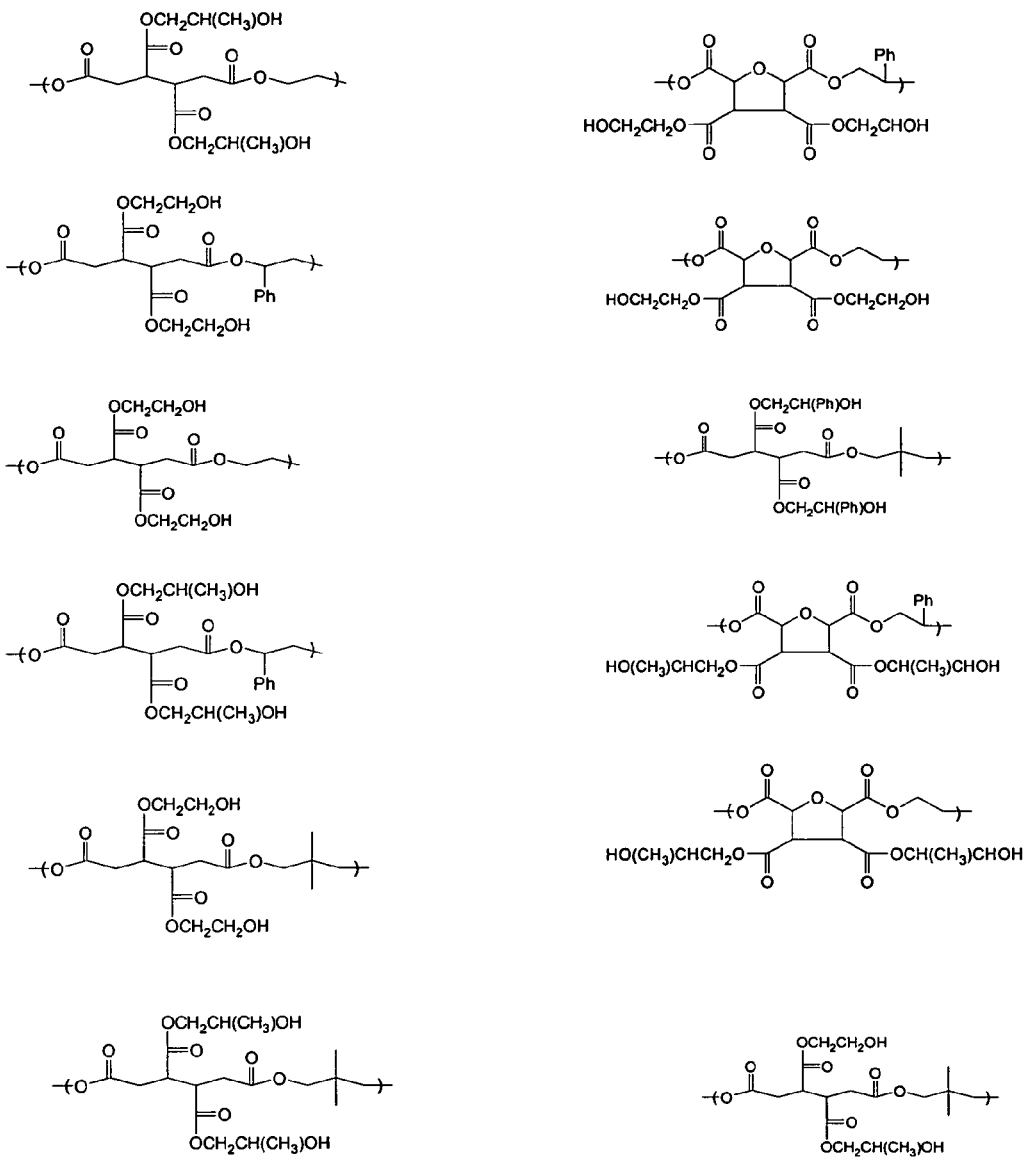
Figure 4: Further examples of polymer unit of Structure (1)

ANTIREFLECTIVE COMPOSITION FOR PHOTORESISTS

FIELD OF THE INVENTION

The present invention relates to a novel antireflective coating composition and its use in image processing by forming a thin layer of the novel antireflective coating composition between a reflective substrate and a photoresist coating. Such compositions are particularly useful in the fabrication of semiconductor devices by photolithographic techniques.

BACKGROUND

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

The use of highly absorbing antireflective coatings in photolithography is one approach to diminish the problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes. Reflective notching becomes severe as the photoresist is patterned over substrates containing topographical features, which scatter light through the photoresist film, leading to line width variations, and in the extreme case, forming regions with complete photoresist loss.

In cases where further reduction or elimination of line width variation is required, the use of bottom antireflective coating provides the best solution for the elimination of reflectivity. The bottom antireflective coating is applied to the substrate prior to coating with the photoresist and prior to exposure. The photoresist is exposed imagewise and developed. The antireflective coating in the exposed area is then etched, typically in gaseous plasma, and the photoresist pattern is thus transferred to the substrate. The etch rate of the antireflective film should be relatively high in comparison to the photoresist so that the antireflective film is etched without excessive loss of the photoresist film during the etch process. Antireflective coatings must also possess the correct absorption and refractive index at the wavelength of exposure to achieve the desired lithographic properties.

It is necessary to have a bottom antireflective coating that functions well at exposures less than 230 nm. Such antireflective coatings need to have high etch rates and be sufficiently absorbing with the correct refractive index to act as antireflective coatings.

The novel antireflective coatings of the present invention, comprising a novel polyester polymer based on a unique chemical structure, have been found to have good dry etching properties, which enable a good image transfer from the photoresist to the substrate, and also good absorption characteristics to prevent reflective notching and line width variations or standing waves, particularly at 193 nm. The antireflective coating of the present invention has a relatively high etch rate such that the antireflective coating is removed with minimal loss in the thickness of the photoresist layer. Additionally, substantially no intermixing is present between the antireflective coating and the photoresist film. The antireflective coatings also have good solution stability and form particularly thin films with good coating quality, the latter being particularly advantageous for lithography. When the antireflective coating is used with a photoresist in the imaging process, clean images are obtained with good lithographic properties.

BRIEF DESCRIPTION OF THE DRAWINGS

FIG. 1 shows examples of the linking moiety A.
FIG. 2 illustrates examples of aliphatic dianhydrides.
FIG. 3 gives examples of polymer unit of Structure (1).
FIG. 4 gives more examples of polymer unit of Structure (1).

SUMMARY

The invention relates to an antireflective coating composition for a photoresist layer comprising a polymer, a crosslinking agent and an acid generator, where the polymer comprises at least one unit of structure 1,

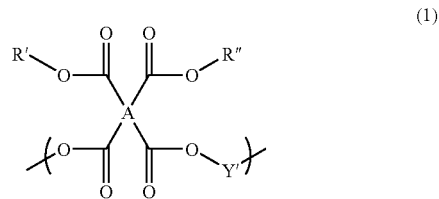

where,

A is a nonaromatic linking moiety,

R' and R" are independently selected from hydrogen, Z and W—OH, where Z is a $(C_1-C_{20})$ hydrocarbyl moiety and W is a $(C_1-C_{20})$ hydrocarbyl linking moiety, and, Y' is independently a $(C_1-C_{20})$ hydrocarbyl linking moiety.

The invention further relates to a process for imaging the antireflective coating composition.

DESCRIPTION OF THE INVENTION

The present invention relates to a novel antireflective coating composition comprising a polymer, a crosslinking agent and an acid generator. The present invention further relates to a process for using the novel composition, particularly at 193 nm. The polymer of the present invention contains at least one unit selected from structure (1)

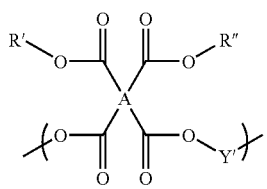

(1)

where,

A is a nonaromatic linking moiety,

R' and R" are independently selected from hydrogen, Z and W—OH, where Z is a ($C_1$-$C_{20}$) hydrocarbyl moiety and W is a ($C_1$-$C_{20}$) hydrocarbyl linking moiety, and, Y' is independently a ($C_1$-$C_{20}$) hydrocarbyl linking moiety.

In the polymer of the present composition A is a nonaromatic group or a nonaromatic linking moiety that connects the 4 carboxyl (C(O)O) groups. The group A may also be defined as a nonaromatic aliphatic group. In one embodiment A is selected from $C_1$-$C_{20}$ unsubstituted alkylene, $C_1$-$C_{20}$ substituted alkylene, $C_1$-$C_{20}$ unsubstituted cycloaliphatic, $C_1$-$C_{20}$ substituted cycloaliphatic, $C_1$-$C_{20}$ unsubstituted heterocycloaliphatic, and $C_1$-$C_{20}$ substituted heterocycloaliphatic. Some examples of A are given in FIG. 1. In another embodiment A is selected from $C_4$-$C_{10}$ unsubstituted alkylene, a $C_4$-$C_{10}$ substituted alkylene, $C_1$-$C_{20}$ unsubstituted heterocycloaliphatic, and $C_1$-$C_{20}$ substituted heterocycloaliphatic. In yet another embodiment A is selected from $C_4$-$C_{10}$ unsubstituted alkylene and a $C_4$-$C_{10}$ substituted alkylene. In yet another embodiment A is butylene. Typically a polymer is obtained by reacting at least one aliphatic dianhydride with at least one diol. The resulting polymer may be further reacted with an end capping reactant to cap one or more of the free acid groups. Examples of the aliphatic dianhydrides that upon polymerization form A are given in FIG. 2.

In one embodiment of the polymer of the composition, the polymer is represented by only one or more aliphatic A moiety, that is, the polymer is not derived from an additional aromatic anhydride.

In one embodiment the polymer comprises at least one unit of Structure 2,

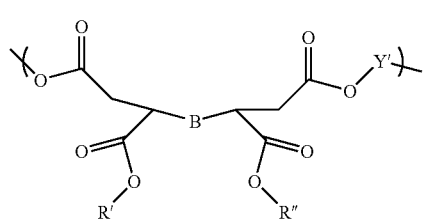

(2)

where,

B is a single bond or $C_1$-$C_6$ nonaromatic aliphatic moiety,

R' and R" are independently selected from hydrogen, Z and W—OH, where Z is a ($C_1$-$C_{20}$) hydrocarbyl moiety and W is a ($C_1$-$C_{20}$) hydrocarbyl linking moiety, and, Y' is independently a ($C_1$-$C_{20}$) hydrocarbyl linking moiety.

In one embodiment B is selected from a single bond and a $C_1$-$C_6$ alkylene which may be linear or branched. In another embodiment B is a single bond. Further examples of the polymeric structure (1) are given in FIG. 3, where, R' and R" are independently selected from hydrogen, Z and W—OH, where Z is a ($C_1$-$C_{20}$) hydrocarbyl moiety and W is a ($C_1$-$C_{20}$) hydrocarbyl linking moiety, and, Y' is independently a ($C_1$-$C_{20}$) hydrocarbyl linking moiety.

The polymer may be derived from at least one aliphatic dianhydride and may include other aliphatic and or/aromatic dianhydrides. One or a mixture of diols may be used to react with the dianhydride(s) to form the polymer. Examples of aromatic dianhydrides are pyromellitic dianhydride, 3,6-diphenylpyromellitic dianhydride, 3,6-bis(trifluoromethyl) pyromellitic dianhydride, 3,6-bis(methyl)pyromellitic dianhydride, 3,6-diiodopyromellitic dianhydride, 3,6-dibromopyromellitic dianhydride, 3,6-dichloropyromellitic dianhydride, 3,3',4,4'-benzophenonetetracarboxylic acid dianhydride, 2,3,3',4'-benzophenonetetracarboxylic acid dianhydride, 2,2',3,3'-benzophenone tetracarboxylic acid dianhydride, 3,3',4,4'-biphenyltetracarboxylic acid dianhydride, 2,3,3'4'-biphenyltetracarboxylic acid dianhydride. 2,2', 3,3'-biphenyltetracarboxylic acid dianhydride, 2,2',6,6'-biphenyltetracarboxylic acid dianhydride, bis(2,3-dicarboxyphenyl)methane dianhydride, bis(2,5,6-trifluoro-3, 4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, bis(3,4-dicarboxyphenyl)ether dianhydride (4,4'-oxydiphthalic dianhydride), bis(3,4-dicarboxyphenyl) sulfone dianhydride (3,3',4,4'-diphenylsulfonetetracarboxylic dianhydride), 4,4'-[4,4'-isopropylidene-di(p-phenyleneoxy)]bis(phthalic anhydride), N,N-(3,4-dicarboxyphenyl)-N-methylamine dianhydride, bis(3,4-dicarboxyphenyl)diethylsilane dianhydride; 2,3,6,7-naphthalene tetracarboxylic acid dianhydride, 1,2,5,6-naphthalene-tetracarboxylic acid dianhydride, 1,4,5,8-naphthalenetetracarboxylic acid dianhydride, 2,6-dichloronaphthalene-1,4,5,8-tetracarboxylic acid dianhydride, thiophene-2,3,4,5-tetracarboxylic acid dianhydride, pyrazine-2,3,5,6-tetracarboxylic acid dianhydride, pyridine-2,3,5,6-tetra carboxylic acid dianhydride, 2,3,9,10-perylene tetracarboxylic acid dianhydride, 4,4'-(1,4-phenylene) bis(phthalic acid) dianhydride, 4,4'-(1,3-phenylene) bis(phthalic acid) dianhydride, 4,4'-oxydi(1,4-phenylene)bis (phthalic acid)dianhydride, 4,4'-methylenedi(1,4-phenylene) bis(phthalic acid)dianhydride, hydroquinonediether dianhydride, 4,4'-biphenoxy dianhydride. Another example of a dianhydride is bicyclo[2.2.2]oct-7-ene-2,3,5,6-tetracarboxylic dianhydride.

In the polymer of the present invention, Y' is a hydrocarbyl moiety. Typically Y' is derived from the diol reactant to form the polymer. More than one type of diol may be used to form the polymer. R' and R" are independently selected from hydrogen, Z and W—OH, where Z is a ($C_1$-$C_{20}$) hydrocarbyl moiety and W is a ($C_1$-$C_{20}$) hydrocarbyl linking moiety, and, Y' is independently a ($C_1$-$C_{20}$) hydrocarbyl linking moiety. Typically, where R' and R" are W or W—OH, R' and R" are derived from the reaction of the free carboxylic acid and the end capping reactant.

As used herein and throughout the application, the term "hydrocarbyl" or "hydrocarbyl substituent" or "hydrocarbyl group" or "hydrocarbyl linking moiety" or "hydrocarbyl moeity" is used in its ordinary sense, which is well-known to those skilled in the art. Specifically, it refers to a group having carbon atom(s) directly attached to the molecule and having predominantly hydrocarbon character.

Examples of Hydrocarbyl Groups Include:

(1) hydrocarbon groups, that are, aliphatic (e.g., alkyl, alkylenyl or alkenyl or alkylene), alicyclic (e.g., cycloalkyl, cycloalkenyl or cycloalkylene), aromatic, aliphatic- and alicyclic-substituted aromatic substituents, as well as cyclic substituents wherein the ring is completed through another portion of the molecule (e.g., two substituents together form an alicyclic radical);

(2) hydrocarbon groups that contain atoms other than carbon and hydrogen but are predominantly hydrocarbon in nature, where examples of other atoms are sulfur, oxygen or nitrogen, which may be present alone (such as thia or ether) or as functional linkages such as ester, carboxyl, carbonyl, cyclic ether, etc.;

(3) substituted hydrocarbon groups, that is, substituents containing non-hydrocarbon groups which, in the context of this invention, do not alter the predominantly hydrocarbon substituent (e.g., halo (especially chloro and fluoro), hydroxy, alkoxy, mercapto, alkylmercapto, nitro, nitroso, and sulfoxy);

(4) hetero substituents, that is, substituents which, while having a predominantly hydrocarbon character, in the context of this invention, contain other than carbon in a ring or chain otherwise composed of carbon atoms. Heteroatoms include sulfur, oxygen, nitrogen, and encompass substituents as pyridyl, furyl, thienyl and imidazolyl. In general, no more than two, preferably no more than one, non-hydrocarbon substituent will be present for every ten carbon atoms in the hydrocarbyl group.

Examples of hydrocarbyl groups are substituted or unsubstituted aliphatic ($C_1$-$C_{20}$) alkylene group, substituted or unsubstituted aliphatic ($C_1$-$C_{20}$) alkyl group, substituted or unsubstituted aliphatic ($C_1$-$C_{20}$) cycloalkyl group, substituted or unsubstituted thia-alkylene aliphatic ($C_1$-$C_{20}$) group, substituted or unsubstituted cycloalkylene, substituted or unsubstituted benzyl, alkoxy alkylene, alkoxyaryl, aryl, substituted aryl, substituted or unsubstituted aliphatic ($C_1$-$C_{20}$) alkylenearyl, hetero cycloalkylene, heteroaryl, oxocyclohexyl, cyclic lactone, hydroxy alkyl, hydroxyalkoxyl, alkoxy alkyl, alkoxyaryl, alkylaryl, alkenyl, aryl esters, esters with aromatic substituents, hetero cycloalkyl, heteroaryl, nitroalkyl, haloalkyl, alkylimide, alkyl amide, or mixtures thereof.

In the above definitions and throughout the present application, aliphatic refers to a predominantly hydrocarbon chain which is nonaromatic. Aliphatic may be linear, branched, cyclic or mixtures of thereof. Substituted or unsubstituted alkylene or thiaalkylene ($C_1$-$C_{20}$) group means an alkylene or a thiaalkylene group which is predominantly a hydrocarbon chain that may be linear or branched containing up to 20 carbon atoms, and where the substituents are those which do not typically change the hydrocarbon nature of the chain and may be all organic compounds known to those of ordinary skill in the art, such as ether, alkyl, ester, hydroxyl, alkynol, cyano, nitro, acyl, halogen (chloro or bromo), phenyl and substituted phenyl. A thiaalkylene group contains one or more sulfur groups in the chain. An example of aliphatic substituted or unsubstituted thia-alkylene ($C_1$-$C_{20}$) group is without limitation, 3,6-dithia-1,8-octylene.

In the above definitions and throughout the present specification, unless otherwise stated the terms used are described below.

Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n- or iso-propyl, n-, iso, or tert-butyl, linear or branched pentyl, hexyl, heptyl, octyl, decyl, dodecyl, tetradecyl and hexadecyl.

Unless otherwise stated, alkyl refers to 1-20 carbon atom moeity. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicycle[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.2,9]undecane, tricyclo[4.2.1.2.7,9]undecane, tricyclo[5.3.2.0.4,9]dodecane, and tricyclo[5.2.1.0.2,6] decane. As mentioned herein the cyclic alkyl groups may have any of the acyclic alkyl groups as substituents.

Alkylene groups are divalent alkyl groups derived from any of the alkyl groups mentioned hereinabove. When referring to alkylene groups, these include an alkylene chain substituted with ($C_1$-$C_6$) alkyl groups in the main carbon chain of the alkylene group. Alkylene groups can also include one or more alkyne or alkene groups in the alkylene moiety, where alkyne refers to a triple bond and alkene refers to double bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-2,5-hexene, 2,5-dimethyl-2,5-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above.

Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like.

Alkoxy means straight or branched chain alkoxy having 1 to 20 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy.

Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

Alkylenearyl means an aliphatic alkylene moeity with pendant aryl groups. Examples are 1-phenyl-1,2-ethylene and 1-phenylpropylene.

Furthermore, and as used herein, the term "substituted" is contemplated to include all permissible substituents of organic compounds. In a broad aspect, the permissible substituents include acyclic and cyclic, branched and unbranched, carbocyclic and heterocyclic, aromatic and non-aromatic substituents of organic compounds. Illustrative substituents include, for example, those described hereinabove. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

Halogen refers to fluorine, chlorine and bromine, although fluorine and chlorine are preferred.

The moiety Y' is derived from the diol or similar compounds to form the polymer. Y' may be exemplified by ($C_1$-$C_{20}$) substituted or unsubstituted alkylene, substituted or unsubstituted thia-alkylene aliphatic ($C_1$-$C_{20}$) group, substituted or unsubstituted cycloalkylene, substituted or unsubstituted benzyl, alkoxy alkylene, alkoxyaryl, alkyleneester substituted with an absorbing chromophore such as phenyl, naphthyl or anthracyl, substituted aryl, hetero cycloalkylene, heteroalkyl, heteroaryl, oxocyclohexyl, cyclic lactone, benzyl, substituted benzyl, hydroxy alkyl, hydroxyalkoxyl, alkoxy alkyl, alkoxyaryl, alkylenearyl, alkylaryl, alkenyl, substituted aryl, alkylenearylate, hetero cycloalkyl, heteroaryl, nitroalkyl, haloalkyl, alkylimide, alkyl amide and mixtures thereof. More specific examples are methylene (—$CH_2$—), ethylene ($CH_2CH_2$), propylene, butylene, 1-phenyl-1,2-ethylene, neopentylene, ethylenephenylate, 2-bromo-2-nitro-1,3-propylene, 2-bromo-2-methyl-1,3-propylene, polyethyleneglycol, 1-phenylate-1,2-ethylene, 1-benzylate-1,2-ethylene, —$CH_2OCH_2$—, —$CH_2CH_2OCH_2CH_2$—, —$CH_2CH_2SCH_2CH_2$—, or —$CH_2CH_2SCH_2CH_2SCH_2CH_2$—, phenyl derivative, naphthyl derivative, anthracyl derivatives, propylenephenyl acetate, 2-propylenephenyl acetate (—$CH_2CH_2(CH_2CO_2CH_2Ph)$, propylene phenyl ether (—$CH_2CH_2(CH_2OPh)$, propylene phenolate (—$CH_2CH_2(CH_2CO_2Ph)$), propylene naphthoate, propylenephthalimide, propylenesuccinimide, propylene crotylidene acetate (—$CH_2CH_2(CH_2CO_2CHCHCHCHCH_3)$). Some of the monomers which may be used to synthesize the polymer of the present invention and which can represent the Y' component are, preferably, diols, and glycols, examples of which are, ethylene glycol, diethylene glycol, propylene glycol, 1-phenyl-1,2-ethanediol, 2-bromo-2-nitro-1,3-propane diol, 2-methyl-2-nitro-1,3-propanediol, diethylbis(hydroxymethyl)malonate, and 3,6-dithia-1,8-octanediol. Examples of aromatic diols are 2,6-bis(hydroxymethyl)-p-cresol and 2,2'-(1,2-phenylenedioxy)-diethanol, 1,4-benzenedimethanol, 1-phenylate-1,2-ethanediol derived from the reaction of phenylacetic acid and glycidol, reaction product of glycidol and phenol, reaction product of glycidol and benzoic acid, reaction product of glycidol and naphthoic acid, reaction product of glycidol and anthracene carboxylic acid. Others are reaction product of glycidol and phthalimide, reaction product of glycidol and succinimide, and reaction product of glycidol and sorbic acid.

The polymer of the present invention may have one or more of the pendant carboxyl groups derived from the dianhydride present as a free acid or capped with a capping group. In one embodiment of the polymer at least one of R' and R" is represented by Z and/or —W—OH as shown in structure 1 and 2. Z is represented by a hydrocarbyl group as described previously and exemplified by substituted or unsubstituted aliphatic ($C_1$-$C_{20}$) alkyl group, substituted or unsubstituted aliphatic ($C_1$-$C_{20}$) cycloalkyl group, substituted or unsubstituted aliphatic ($C_1$-$C_{20}$) aryl group, and substituted or unsubstituted aliphatic ($C_1$-$C_{20}$) alkylenearyl group. W may be exemplified by a hydrocarbyl linking group as described previously and exemplified by substituted or unsubstituted aliphatic ($C_1$-$C_{20}$) alkylene group, substituted or unsubstituted aliphatic ($C_1$-$C_{20}$) cycloalkylene group, substituted or unsubstituted aliphatic ($C_1$-$C_{20}$) aryl group, and substituted or unsubstituted aliphatic ($C_1$-$C_{20}$) alkylenearyl group. The alcohol capping group, W—OH, may be further exemplified by methanol, ethanol, propanol, isopropanol, 1-butanol, isobutanol, 2-methyl-2-butanol, 2-methyl-1-butanol, 3-methyl-1-butanol, tertiary butanol, cyclopentanol, cyclohexanol, 1-hexanol, 1-heptanol, 2-heptanol, 3-heptanol, 1-n-octanol, 2-n-octanol, l-phenyl-1-ethanol and the like. Examples of the hydroxyl-forming compound useful for reacting with the carboxylic acid, where the carboxylic acid group is derived from the dianhydride, and forming the W—OH group, include aromatic oxide, aliphatic oxide, alkylene carbonate, and can be further exemplified by styrene oxide, propylene oxide, ethylene carbonate and the like. Examples of aromatic oxides include: styrene oxide, 1,2-epoxy-phenoxypropane, glycidyl-2-methylphenyl ether, (2,3-epoxypropyl)benzene, 1-phenylpropylene oxide, stilbene oxide, 2-(or 3- or 4-)halo(chloro, fluoro, bromo, iodo) stilbene oxide, benzyl glycidyl ether, $C_{1-10}$ straight or branched chain alkyl(e.g., methyl, ethyl, propyl, butyl, sec-butyl, tert-butyl, pentyl, hexyl, heptyl, and the like etc)phenyl glycidyl ether, 4-halo(chloro, fluoro, bromo, iodo)phenyl glycidyl ether, glycidyl 4-$C_{1-10}$ straight or branched chain alkoxy(e.g., methoxy, ethoxy, propoxy, butoxy, hexyloxy, heptyloxy, and the like etc)phenyl ether, 2,6-dihalo(chloro, fluoro, bromo, iodo)benzylmethyl ether, 3,4-dibenzyloxybenzyl halide (chloride, fluoride, bromide, iodide), 2-(or 4-)methoxybiphenyl, 3,3'-(or 4,4'-)di$C_{1-10}$ straight or branched chain alkoxy (e.g., methoxy, ethoxy, propoxy, butoxy, hexyloxy, heptyloxy, and the like etc)biphenyl, 4,4'-dimethoxyoctafluorobiphenyl, 1-(or 2-)$C_{1-10}$ straight or branched chain alkoxy (e.g., methoxy, ethoxy, propoxy, butoxy, hexyloxy, heptyloxy, and the like etc)naphthalene, 2-halo(chloro, fluoro, bromo, iodo)-6-methoxynaphthalene, 2,6-di$C_{1-10}$ straight or branched chain alkoxy(e.g., methoxy, ethoxy, propoxy, butoxy, hexyloxy, heptyloxy, and the like etc)naphthalene, 2,7-di$C_{1-10}$ straight or branched chain alkoxy(e.g., methoxy, ethoxy, propoxy, butoxy, hexyloxy, heptyloxy, and the like etc)naphthalene, 1,2,3,4,5,6-hexahalo(chloro, fluoro, bromo, iodo)-7-$C_{1-10}$ straight or branched chain alkoxy(e.g., methoxy, ethoxy, propoxy, butoxy, hexyloxy, heptyloxy, and the like etc)naphthalene, 9,10-bis(4-$C_{1-10}$ straight or branched chain alkoxy(e.g., methoxy, ethoxy, propoxy, butoxy, hexyloxy, heptyloxy, and the like etc)phenyl)-anthracene, 2-$C_{1-10}$ straight or branched chain alkyl(e.g., methyl, ethyl, propyl, butyl, sec-butyl, tert-butyl, pentyl, hexyl, heptyl, and the like etc)-9,10-di$C_{1-10}$ straight or branched chain alkoxy(e.g., methoxy, ethoxy, propoxy, butoxy, hexyloxy, heptyloxy, and the like etc)anthracene, 9,10-bis(4-$C_{1-10}$ straight or branched chain alkoxy(e.g., methoxy, ethoxy, propoxy, butoxy, hexyloxy, heptyloxy, and the like etc)phenyl)-2-halo(chloro, fluoro, bromo, iodo)-anthracene, 2,3,6,7,10,11-hexamethoxytriphenylene, glycidyl-3-(pentadecadienyl)phenyl ether, 4-t-butylphenylglycidyl ether, triphenylolmethane triglycidyl ether, [(4-(1-heptyl-8-[3-(oxiranylmethoxy)phenyl]-octyl)phenoxy)methyl]oxirane, tetraphenylolethane tetraglycidyl ether, hydroxyphenol diglycidyl ether, etc. Examples of aliphatic oxides include ethylene oxide, propylene oxide, butylene oxides, including isobutylene oxide, 1,2-butylene oxide and 2,3-butylene oxide, pentylene oxide, cyclohexene oxide, decyl glycidyl ether, and dodecyl glycidyl ether. Examples of alkylene carbonates include those compounds having the formula

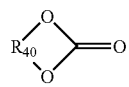

where $R_{40}$ is $C_2$-$C_4$ alkyl where the aliphatic ring carbons are unsubstituted or substituted with a group selected from $C_1$-$C_{10}$ alkyl, $C_6$-$C_{10}$ aryl, or $C_6$-$C_{15}$ aralkyl group. Examples of alkylene carbonates are ethylene carbonate, propylene carbonate, and butylene carbonates.

The polymers of this invention may be prepared by any of the standard polymerization methods known in the art, especially condensation polymerization techniques. The polymer may be synthesized using solution, emulsion, bulk, suspension polymerization, or the like. Typically a dianhydride is condensed with a diol or a similar compound, at elevated temperatures, and optionally in the presence of an acid, to give a polyester. The polyester polymer may be reacted further to modify the substituents in the polymer. The resulting carboxylic acid substituent derived from the dianhydride may be in the free acid form, may be reacted to give an ester, or be attached to another polymer chain, or be mixtures of these or other substituents. In one embodiment the free carboxylic acid is reacted to form an ester. In another embodiment the acid group in the polymer is partially esterified. In yet another embodiment the polymer is fully esterified, that is, the polymer does not contain any free acid.

The diols are typically condensed with at least one aliphatic dianhydride. Typically a linear polyester is first prepared by the reaction of a dianhydride and a diol in a suitable solvent. The polymer may be obtained by reacting one dianhydride and one diol or by reacting mixtures of different dianhydrides and/or diols, where at least one dianhydride is an aliphatic dianhydride. The polyester is isolated by precipitation into a non-solvent. The polyester may be further modified by reacting the free carboxylic acid groups with capping compounds such as alcohols, alkene oxide or carbonates. The reaction of the polyester with the capping compound may be done prior to isolation of the polymer or after the isolation of the polymer. The final polymer may be isolated and dried.

In one embodiment the polymer of the present composition is partially crosslinked to increase the molecular weight. Once the polymer is synthesized the polymer may be reacted further with a compound which comprises a group or groups capable of crosslinking the polymer, or crosslinked using a crosslinking agent, such as those taught in the present application. Crosslinking of the polymer may be facilitated by techniques well know to those skilled in the art, for example by heating and/or catalysis. The extent of crosslinking is determined by the desired physical and chemical properties of the polymer. The crosslinked polymer is then formulated into an antireflective coating composition of the present invention.

The weight average molecular weight of the polymer may range from about 1500 to about 180,000, preferably from about 4,000 to about 60,000 and more preferably from about 10,000 to about 30,000. When the weight average molecular weight is below 1,500, then good film forming properties are not obtained for the antireflective coating and when the weight average molecular weight is too high, then properties such as solubility, storage stability and the like may be compromised.

The antireflective coating composition comprises a polymer, a crosslinking agent, an acid generator, and a solvent composition.

A variety of crosslinking agents can be used in the composition of the present invention. Any suitable crosslinking agents that can crosslink the polymer in the presence of an acid may be used. Examples, without limitation, of such crosslinking agents are resins containing melamines, methylols, glycoluril, polymeric glycolurils, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6 bishydroxymethyl p-cresol may be used. Crosslinking agents disclosed in US 2006/0058468 and incorporated herein by reference, where the crosslinking agent is a polymer obtained by reacting at least one glycoluril compound with at least one reactive compound containing at least one hydroxy group and/or at least one acid group may be used.

The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. The photoresist film is heated for a sufficient length of time to react with the coating. Examples of thermal acid generators are metal-free iodonium and sulfonium salts. Other examples of TAGs are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid. Iodonium salts can be exemplified by iodonium fluorosulfonates, iodonium tris(fluorosulfonyl)methide, iodonium bis(fluorosulfonyl)methide, iodonium bis(fluorosulfonyl)imide, iodonium quaternary ammonium fluorosulfonate, iodonium quaternary ammonium tris(fluorosulfonyl) methide, and iodonium quaternary ammonium bis (fluorosulfonyl)imide. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further contain a photoacid generator, examples of which without limitation, are onium salts, sulfonate compounds, nitrobenzyl esters, triazines, etc. The preferred photoacid generators are onium salts and sulfonate esters of hydoxyimides, specifically diphenyl iodnium salts, triphenyl sulfonium salts, dialkyl iodonium salts, triakylsulfonium salts, and mixtures thereof.

The amount of the polymer in the present composition can vary from about 95 weight % to about 50 weight %, preferably about 85 weight % to about 70 weight % and more preferably about 80 weight % to about 70 weight %, relative to the solid portion of the composition. The amount of the crosslinker in the present composition can vary from 5 weight % to about 50 weight %, preferably 15 weight % to about 30 weight % relative to the solid portion of the composition. The amount of the acid generator in the present composition can vary from 0.1 weight % to about 5 weight %, preferably 0.5 weight % to about 3 weight % and more preferably 1 weight % to about 2 weight %, relative to the solid portion of the composition.

Typical solvents, used as mixtures or alone, that can be used for the present composition, without limitation, are propylene glycol monomethyl ether acetate (PGMEA), propylene gycol monomethyl ether (PGME), and ethyl lactate (EL), 2-heptanone, cyclopentanone, cyclohexanone, and gamma butyrolactone, but PGME, PGMEA and EL or mixtures thereof are preferred. Solvents with a lower degree of toxicity, good coating and solubility properties are generally preferred.

The antireflective coating composition comprises the copolymer, crosslinker and acid generator of the instant invention and a suitable solvent or mixtures of solvents. Other components may be added to enhance the performance of the coating, e.g. monomeric dyes, lower alcohols, surface leveling agents, adhesion promoters, antifoaming agents, etc. Other polymers, such as, novolaks, polyhydroxystyrene, polymethylmethacrylate and polyarylates, may be added to the composition, providing the performance is not negatively impacted. Preferably the amount of this polymer is kept below 50 weight % of the total solids of the composition, more preferably 20 weight %, and even more preferably below 10 weight %.

The optical characteristics of the antireflective coating are optimized for the exposure wavelength and other desired lithographic characteristics. As an example the absorption parameter (k) of the novel composition for 193 nm exposure ranges from about 0.1 to about 1.0, preferably from about 0.2 to about 0.75, more preferably from about 0.25 to about 0.65 as measured using ellipsometry. The value of the refractive index (n) ranges from about 1.25 to about 2.5, preferably from about 1.3 to about 2.0, and more preferably from about 1.5 to about 2.0. Due to the good absorption characteristics of this composition at 193 nm, very thin antireflective films of the order of about 40 nm may be used. This is particularly advantageous when using a nonaromatic photoresist, such as those sensitive at 193 nm, 157 nm and lower wavelengths, where the photoresist films are thin and must act as an etch mask for the antireflective film. Since the antireflective film is coated on top of the substrate and is further subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The antireflective coating composition is coated on the substrate using techniques well known to those skilled in the art, such as dipping, spin coating or spraying. The film thickness of the antireflective coating ranges from about 15 nm to about 200 nm. The coating is further heated on a hot plate or convection oven for a sufficient length of time to remove any residual solvent and induce crosslinking, and thus insolubilizing the antireflective coating to prevent intermixing between the antireflective coatings. The preferred range of temperature is from about 90° C. to about 250° C. If the temperature is below 90° C. then insufficient loss of solvent or insufficient amount of crosslinking takes place, and at temperatures above 300° C. the composition may become chemically unstable. A film of photoresist is then coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, silicon, silicon substrate coated with a metal surface, copper coated silicon wafer, copper, substrate coated with antireflective coating, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure below 200 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al Advances in Resist Technology and Processing XIX, Proceedings of SPIE Vol. 4690 p76 2002; U.S. Pat. No. 6,818,258) or copolymerization of a fluorodiene with an olefin (W0 01/98834-A1). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide. The developer may further comprise surfactant(s). An optional heating step can be incorporated into the process prior to development and after exposure.

The process of coating and imaging photoresists is well known to those skilled in the art and is optimized for the specific type of resist used. The patterned substrate can then be dry etched with an etching gas or mixture of gases, in a suitable etch chamber to remove the exposed portions of the antireflective film, with the remaining photoresist acting as an etch mask. Various etching gases are known in the art for etching organic antireflective coatings, such as those comprising $CF_4$, $CF_4/O_2$, $CF_4/CHF_3$, $O_2$ or $Cl_2/O_2$.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE™302 ellipsometer.

The molecular weight of the polymers was measured on a Gel Permeation Chromatograph.

Synthesis Example 1

400 g of butanetetracarboxylic acid dianhydride, 280 g of styrene glycol, 40 g of benzyltributylammonium chloride, and 1760 g of propyleneglycol monomethyletheracetate (PGMEA) were charged into a 5 L-flask with a condenser, thermal controller and a mechanical stirrer. Under nitrogen and stirring, the mixture was heated to 110° C. After a clear solution was obtained at this temperature, the temperature was reduced to 100° C. and maintained for 4 hrs. Then 1356 g of propylene oxide was added. The reaction was kept at 50° C. for 48 hrs. The reaction solution was cooled to room temperature and slowly poured into large amount of water in a high speed blender. The polymer was collected and washed thoroughly with water. Finally the polymer was dried in a vacuum oven. 720 g of polymer was obtained with a weight average molecular weight (MW) of about 20,000 g/mol.

Synthesis Example 2

210 g of butanetetracarboxylic acid dianhydride, 36 g of pyromellitic dianhydride, 84 g of styrene glycol, 80.4 g of neopentyl glycol, 3.2 g of benzyltributylammonium chloride, and 1500 g of PGMEA were charged into a 5 L-flask with a condenser, thermal controller and a mechanical stirrer. Under nitrogen and stirring, the mixture was heated to and kept at 100° C. for 16 hrs. Then 760 g of propylene oxide and 3.2 g of benzyltributylammonium chloride were added. The reaction was kept at 56° C. for 36 hrs. The reaction solution was cooled to room temperature and slowly poured into large amount of water in a high speed blender. The polymer was collected and washed thoroughly with water. Finally the polymer was dried in a vacuum oven. 410 g of polymer was obtained with a MW of about 30,000 g/mol.

Synthesis Example 3

15 g of glycidol (0.2 mol) and 27.5 g of phenylacetic acid (0.2 mol) were added to 200 g of PGMEA in a 1000 ml flask. The mixture was heated to 100° C. in the presence of 1.3 g of benzyltributylammonium chloride and maintained at 100° C. for 24 hours. 40 g (0.2 mol) of butanetetracarboxylic acid dianhydride and 2.7 g of benzyltributylammonium chloride was introduced in the above solution and the temperature was raised to 110° C. until a homogeneous solution was obtained. The reaction was kept at 100° C. for 5 h and cooled down to room temperature. 140 g of propylene oxide was added in above mixture and the reaction continued at 50° C. for two days. After cooling down, the product was precipitated in water and air dried. The polymer was re-dissolved in acetone and re-precipitated in water. The material was dried and collected, yielding about 78 g of polymer product (74%) with a weight average molecular weight of 46,900.

Synthesis Example 4

25 g (0.126 mol) of butanetetracarboxylic acid dianhydride, 51 g of polyethylene glycol (Mw=400) and 1.0 g of benzyltributylammonium chloride was added to 175 g of PGMEA. The temperature was raised to 105° C. until a homogeneous solution is obtained. The mixture was maintained at 105° C. for 5 hours. 100 g of PGMEA and (0.55 mol) of styrene oxide was added to the above mixture and the reaction was kept at 80° C. for 48 hours. After cooling down, the product was precipitated in water and air dried. The polymer was re-dissolved in acetone and re-precipitated in water. The material was dried and collected.

Synthesis Example 5

600 grams of tetramethoxymethyl glycoluril, 96 grams of styrene glycol and 1200 grams of PGMEA were charged into a 2 L jacketed flask with a thermometer, mechanical stirrer and a cold water condenser and heated to 85° C. After a catalytic amount of para-toluenesulfonic acid monohydrate was added, the reaction was maintained at this temperature for 5 hrs. The reaction solution was then cooled to room temperature and filtered. The filtrate was slowly poured into distilled water while stirring to precipitate the polymer. The polymer was filtered, washed thoroughly with water and dried in a vacuum oven (250 grams were obtained). The polymer obtained had a weight average molecular weight of about 17,345 g/mol and a polydispersity of 2.7.

Synthesis Example 6

400 grams of tetramethoxymethyl glycoluril, 132 grams of neopentyl glycol, 51.4 grams of 3,4,5-trimethoxybenzyl alcohol and 1170 grams of PGMEA were charged into a 2000 mL flask with a thermometer, a cold water condenser and a mechanical stirrer. The reaction mixture was heated to 85° C. After a catalytic amount of para-toluenesulfonic acid monohydrate was added, the reaction was maintained at this temperature for 6 hours. The reaction solution was then cooled to room temperature and filtered. The polymer was precipitated in DI water and collected in a filter, washed thoroughly with water and dried in a vacuum oven (200 grams were obtained). The polymer obtained had a weight average molecular weight of about 8,000 g/mol and a polydispersity of 3.

Synthesis Example 7

1000 grams of tetramethoxymethyl glycoluril, 500 grams of neopentyl glycol and 3000 grams of PGMEA were charged into a 5000 mL flask with a thermometer, a cold water condenser and a mechanical stirrer. The reaction mixture was heated to 85° C. After a catalytic amount of para-toluenesulfonic acid monohydrate was added, the reaction was maintained at this temperature for 8.0 hours. The reaction solution was then cooled to room temperature and filtered. The polymer was precipitated in DI water and collected on a filter, washed thoroughly with water and dried in a vacuum oven (400 grams were obtained). The polymer obtained had a weight average molecular weight of about 8,000 g/mol and a polydispersity of 3.

Evaluation Example 1

An antireflective coating composition was made by dissolving 8.69 g of polymer from synthesis example 1, 2.174 g of tetrakis(methoxymethyl)glycoluril (MX-270 available from Sanwa Chemicals, Hiratsuka, Japan), 0.087 g triethylammonium salts of p-toluenesulfonic acid in 167.73 g PGMEA and 71.89 g PGME. The solution was filtered through 0.2 µm filter.

The above solution was spun onto an 8" silicon wafer at ~3000 rpm and the wafer was then baked at 200° C. for 60 seconds to give a film thickness of 78 nm. Then the wafer was used to measure refractive indices, n and k, on a J. A. Woollam VUV-Vase Ellipsometer, ModelVU-302. Refractive indices of the film were found to be as following: n (193 nm)=1.858, k (193 nm)=0.342.

The performance of the anti-reflective coating formulation was evaluated using AZ® AX1120P photoresist (product of AZ Electronic Materials USA Corp., Somerville, N.J., USA). About 78 nm thick antireflective coating film was coated and baked at 200° C. for 60 seconds on a silicon wafer with the anti-reflective coating formulation of this Example. Then a 270 nm thick AZ® EXP AX1120P photoresist solution was coated and baked at 130° C. for 60 seconds. The wafer was then imagewise exposed using a Nikon NSR-S306D Scanner with 0.78NA, under ⅔ annular illumination of 0.56/0.85 sigma with 6% HTPSM mask. The exposed wafer was baked at 130° C. for 60 seconds and developed using a 2.38 wt % aqueous solution of tetramethyl ammonium hydroxide for 60 seconds. At an exposure dose of 30 mJ/cm$^2$, the line and space patterns at 90 nm 1:1 pitch were observed under scanning electron microscope and showed no standing waves, indicating the efficacy of the bottom anti-reflective coating. The depth of focus for the above patterns at the above dose was greater than 0.35 µm.

Evaluation Example 2

An antireflective coating composition was made by dissolving 3.45 g of polymer from synthesis example 1, 3.45 g of polymer from synthesis example 5, 0.069 g triethylammonium salts of p-Toluenesulfonic acid in 110.17 g PGMEA and 47.22 g PGME. The solution was filtered through 0.2 µm filter.

The above solution was spun coated onto an 8" silicon wafer at ~3000 rpm and the wafer was then baked at 200° C. for 60 seconds. Then the wafer was used to measure the refractive indices n and k on a J. A. Woollam VUV-Vase Ellipsometer, Model VU-302. Refractive indices of the film were found to be as following: n (193 nm)=1.858, k (193 nm)=0.372.

The performance of the anti-reflective coating formulation was evaluated using AZ® AX1120P photoresist (product of AZ Electronic Materials USA Corp., Branchburg, N.J.). About 78 nm thick film was coated and baked at 200° C. for 60 seconds on a silicon wafer with the anti-reflective coating formulation of this Example. Then a 270 nm thick AZ® EXP AX1120P photoresist solution was coated and baked at 130° C. for 60 seconds. The wafer was then imagewise exposed using a Nikon NSR-S306D Scanner with 0.78 NA, under ⅔ annular illumination of 0.56/0.85 sigma with 6% HTPSM mask. The exposed wafer was baked at 130° C. for 60 seconds and developed using a 2.38 wt % aqueous solution of tetramethyl ammonium hydroxide for 60 seconds. At an exposure dose of 30 mJ/cm$^2$, the line and space patterns at 90 nm 1:1 pitch were observed under scanning electron microscope and showed no standing waves indicating the efficacy of the bottom anti-reflective coating. The depth of focus for the above patterns at above dose was greater than 0.35 µm.

Evaluation Example 3

An antireflective coating composition was prepared by dissolving 2.4 g of polymer from synthesis example 2, 1.2 g of polymer from synthesis 7 and 0.048 g triethylammonium salt of 10-camphorsulfonic acid in 180 g PGMEA. The solution was filtered through 0.2 µm filter.

The performance of the anti-reflective coating formulation was evaluated using AZ® EXP AX1120P photoresist (available from AZ Electronic Materials, Somerville, N.J.). An antireflective film from the above solution was coated on a thin layer AZ® ArF-1C5D BARC (available from AZ Electronic Materials, Somerville, N.J.) on a silicon wafer and baked at 200° C. for 90 seconds. The antireflective film was found to have (n) value of 1.77 and (k) value of 0.16. Using AZ® EXP AX1120P photoresist a 270 nm film was coated and baked at 130° C. for 60 seconds. The wafer was then imagewise exposed using a 193 nm exposure tool. The exposed wafer was baked at 130° C. for 60 seconds and developed using a 2.38 wt % aqueous solution of tetramethyl ammonium hydroxide for 60 seconds. The line and space patterns when observed under scanning electron microscope showed no standing waves, indicating the efficacy of the bottom anti-reflective coating.

Evaluation Example 4

An antireflective coating composition was prepared by dissolving 2.4 g of polymer from synthesis example 2, 1.2 g of polymer from synthesis example 6 and 0.048 g triethylammonium salt of 10-camphorsulfonic acid in 180 g PGMEA. The solution was filtered through 0.2 µm filter.

The performance of the anti-reflective coating formulation was evaluated using AZ® EXP AX1120P photoresist (available from AZ Electronic Materials, Somerville, N.J.). An antireflective coating film from the above solution was coated on a thin layer of AZ® ArF-1C5D BARC (available from AZ Electronic Materials, Somerville, N.J.) coated on a silicon wafer and baked at 200° C. for 90 seconds. The antireflective film was found to have (n) value of 1.75 and (k) value of 0.20. Using AZ® EXP AX1120P photoresist a 270 nm film was coated and baked at 130° C. for 60 seconds. The wafer was then imagewise exposed using a 193 nm exposure tool. The exposed wafer was baked at 130° C. for 60 seconds and developed using a 2.38 wt % aqueous solution of tetramethyl ammonium hydroxide for 60 seconds. The line and space patterns when observed under a scanning electron microscope showed no standing waves indicating the efficacy of the bottom anti-reflective coating.

The invention claimed is:
1. An antireflective coating composition for a photoresist layer, where the antireflective coating composition comprises a polymer, a crosslinking agent and a thermal acid generator, further where the polymer comprises at least one unit of structure 2,

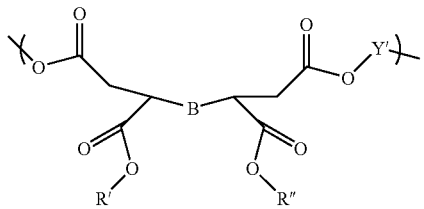

(2)

where,
B is a single bond or $C_1$-$C_6$ nonaromatic aliphatic moiety,
R' and R" are independently selected from hydrogen, Z and W—OH, where Z is a ($C_1$-$C_{20}$) hydrocarbyl moiety and W is a ($C_1$-$C_{20}$) hydrocarbyl linking moiety, and,
Y' is independently a ($C_1$-$C_{20}$) hydrocarbyl linking moiety.

2. The composition of claim 1, where W is selected from substituted or unsubstituted aliphatic ($C_1$-$C_{20}$) alkylene group, substituted or unsubstituted thia-alkylene aliphatic ($C_1$-$C_{20}$) group, substituted or unsubstituted cycloalkylene, alkoxy alkylene, hetero cycloalkylene, and mixtures thereof.

3. The composition of claim 1 where Y' is selected from methylene, ethylene, propylene, butylene, phenylethylene, alkylnitroalkylene, neopentylene, alkylenearylate, dithiaoctylene, bromonitroalkylene, phenylene, naphthylene, derivatives of phenylene, derivatives of naphthylene, and derivatives of anthracylene.

4. The composition of claim 1, where Y' is selected from 1-phenyl-1,2-ethylene, neopentylene, ethylenephenylate, 2-bromo-2-nitro-1,3-propylene, 2-bromo-2-methyl-1,3-propylene, polyethyleneglycol, 1-phenylate-1,2-ethylene, 1-benzylate-1,2-ethylene, —CH$_2$OCH$_2$—, CH$_2$CH$_2$OCH$_2$CH$_2$—, —CH$_2$CH$_2$SCH$_2$CH$_2$—, —CH$_2$CH$_2$SCH$_2$CH$_2$SCH$_2$CH$_2$—, propylenephenyl acetate, 2-propylenephenyl acetate (—CH$_2$CH$_2$(CH$_2$CO$_2$CH$_2$Ph), propylene phenyl ether (—CH$_2$CH$_2$(CH$_2$OPh), propylene phenolate (—CH$_2$CH$_2$(CH$_2$CO$_2$Ph), propylene naphthoate, propylenephthalimide, propylenesuccinimide, propylene crotylidene acetate (—CH$_2$CH$_2$CO$_2$CHCHCHCHCH$_3$).

5. The composition of claim 1, where the crosslinking agent is selected from melamines, methylols, glycolurils, polymeric glycolurils, hydroxy alkyl amides, epoxy and epoxy amine resins, blocked isocyanates, and divinyl monomers.

6. The composition of claim 1, where the thermal acid generator is selected from alkyl ammonium salts of organic acids, phenolic sulfonate esters, nitrobenzyl tosylates, and metal-free iodonium and sulfonium salts.

7. The composition of claim 1, where the polymer is partially crosslinked polymer.

8. The composition of claim 1, where the composition further comprises other polymers selected from polyhydroxystyrene, novolak, polyarylate and polymethylmethacrylate.

9. An article comprising a substrate with a layer of antireflective coating composition of claim 1 and thereon a coating of photoresist comprising a polymer and a photoactive compound.

10. A process for forming an image comprising,
a) coating and baking a substrate with the antireflective coating composition of claim 3;
b) coating and baking a photoresist film on top of the antireflective coating;
c) imagewise exposing the photoresist;
d) developing an image in the photoresist;
e) optionally, baking the substrate after the exposing step.

11. The process of claim 10, where the photoresist is imagewise exposed at wavelengths between 130 nm to 250 nm.

12. The process of claim 10, where the photoresist comprises a polymer and a photoactive compound.

13. The process of claim 10, where the antirefleotive coating is baked at temperatures greater than 90° C.

14. The composition of claim 1, where Z is selected from substituted or unsubstituted aliphatic ($C_1$-$C_{20}$) alkyl group, substituted or unsubstituted aliphatic ($C_1$-$C_{20}$) cycloalkyl group, substituted or unsubstituted aliphatic ($C_1$-$C_{20}$) aryl group, and substituted or unsubstituted aliphatic ($C_1$-$C_{20}$) alkylenearyl group.

15. The composition of claim 1, where W—OH is selected from methanol, ethanol, propanol, isopropanol, 1-butanol, isobutanol, 2-methyl-2-butanol, 2-methyl-1-butanol, 3-methyl-1-butanol, tertiary butanol, cyclopentanol, cyclohexanol, 1-hexanol, 1-heptanol, 2-heptanol, 3-heptanol, 1-n-octanol, 2-n-octanol, and 1-phenyl-1-ethanol.

16. The composition of claim 1, where R' and R" are independently W—OH, where W is a ($C_1$-$C_{20}$) hydrocarbyl linking moiety.

17. An antireflective costing composition for a photoresist layer, where the antireflective coating composition comprises a polymer, a crosslinking agent and a thermal acid generator, further where the polymer comprises at least one unit of structure 2,

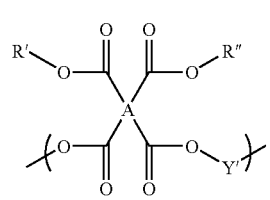

(1)

where, B is a single bond or $C_1$-$C_6$ nonaromatic aliphatic moiety, R' and R" are independently selected from hydrogen, Z and W—OH, where Z is a ($C_1$-$C_{20}$) hydrocarbyl moiety and W is a ($C_1$-$C_{20}$) hydrocarbyl linking moiety, and,
Y' is independently a ($C_1$-$C_{20}$) hydrocarbyl linking moiety, and where the composition further comprises a photoacid generator.

18. An antireflective coating composition for a photoresist layer where the antireflective coating composition comprises a polymer, a crosslinking agent and a thermal acid generator, further where the polymer comprises at least one unit of structure

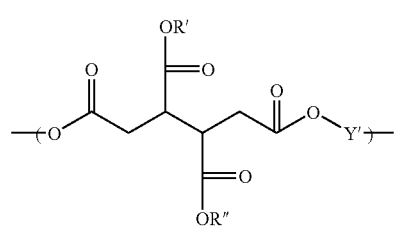

where R' and R" are independently selected from hydrogen, Z and W—OH, where Z is a ($C_1$-$C_{20}$) hydrocarbyl moiety and W is a ($C_1$-$C_{20}$) hydrocarbyl linking moiety, and, Y' is independently a ($C_1$-$C_{20}$) hydrocarbyl linking moiety.

19. The composition of claim 18 where W is independently selected from substituted or unsubstituted aliphatic ($C_1$-$C_{20}$) alkylene group, substituted or unsubstituted thia-alkylene aliphatic ($C_1$-$C_{20}$) group, substituted or unsubstituted cycloalkylene, alkoxy alkylene, hetero cycloalkylene, and mixtures thereof, and where Y' is selected from methylene, ethylene, propylene, butylene, phenylethylene, alkylnitroalkylene, neopentylene, alkylenearylate, dithiaoctylene, bromonitroalkylene, phenylene, naphthylene, derivatives of phenylene, derivatives of naphthylene, and derivatives of anthracylene.

20. An antireflective coating composition for a photoresist layer where the antireflective coating composition comprises a polymer, a crosslinking agent and a thermal acid generator, further where the polymer comprises at least one unit selected from

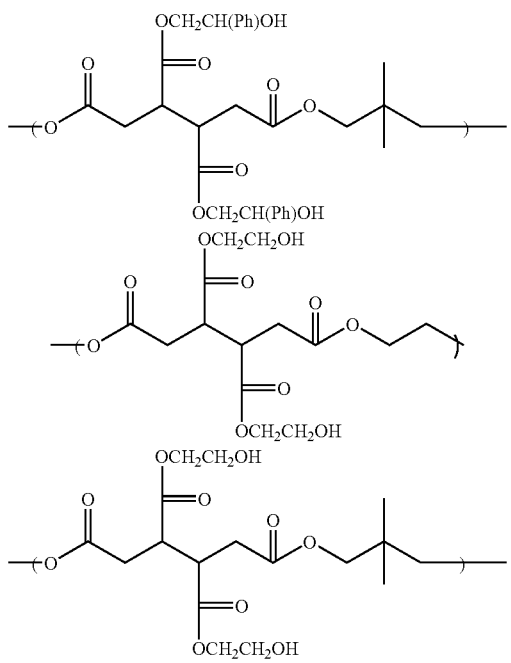

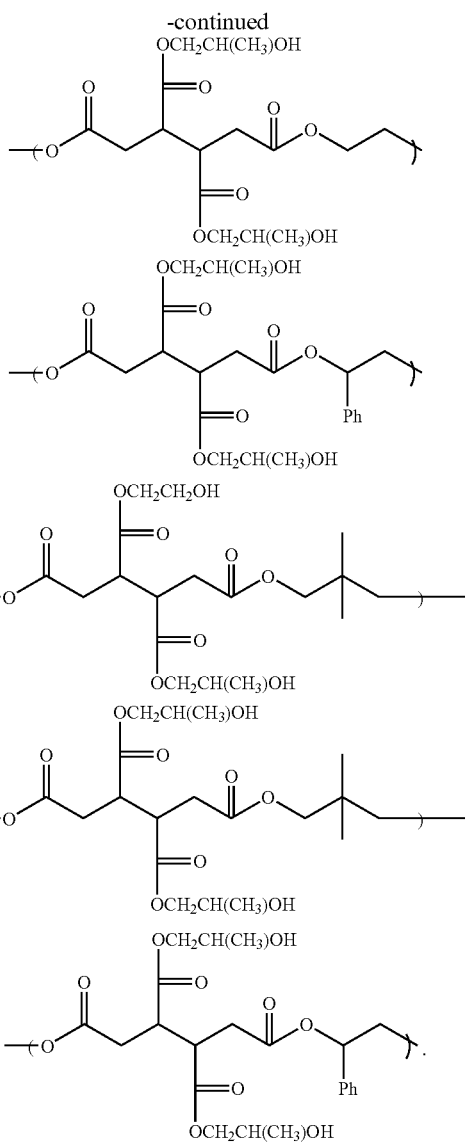

* * * * *

UNITED STATES PATENT AND TRADEMARK OFFICE
CERTIFICATE OF CORRECTION

PATENT NO.        : 7,638,262 B2
APPLICATION NO. : 11/502706
DATED             : December 29, 2009
INVENTOR(S)       : Hengpeng Wu et al.

It is certified that error appears in the above-identified patent and that said Letters Patent is hereby corrected as shown below:

Col. 18, replace the incorrect chemical structure in claim 17 with the correct chemical structure below:

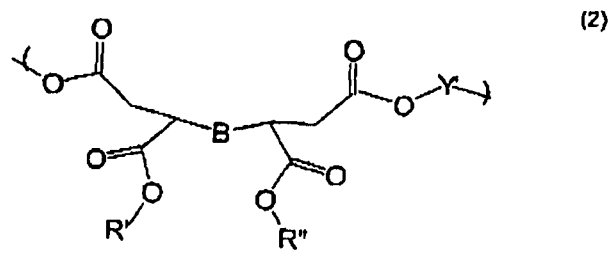

Signed and Sealed this

Second Day of November, 2010

David J. Kappos
*Director of the United States Patent and Trademark Office*